United States Patent [19]

Giardinelli

[11] Patent Number: 4,491,799
[45] Date of Patent: Jan. 1, 1985

[54] DEVICE FOR INDICATING POLE-ZERO CANCELLATION, IN PARTICULAR FOR AMPLIFIERS FOR IONIZING RADIATION SPECTROSCOPY

[75] Inventor: Silvano C. Giardinelli, Milan, Italy

[73] Assignee: Silena S.p.A., Milan, Italy

[21] Appl. No.: 383,493

[22] Filed: Jun. 1, 1982

[30] Foreign Application Priority Data

Jun. 12, 1981 [IT] Italy ................. 22281 A/81

[51] Int. Cl.³ .......................................... G01R 23/00
[52] U.S. Cl. ........................................ 330/2; 328/151
[58] Field of Search .................. 330/2; 307/353; 328/151

[56] References Cited

U.S. PATENT DOCUMENTS 3,717,818  2/1973  Herbst .................. 307/353 X
3,743,952  7/1973  Comley, Jr. et al. ........ 328/151 X Primary Examiner—James B. Mullins
Assistant Examiner—Steven J. Mottola
Attorney, Agent, or Firm—Bucknam and Archer

[57] ABSTRACT

The device consists essentially of a sampler device for sampling the baseline after every pulse processed in the spectroscopy amplifier, coupled to an averager circuit for averaging the samples, and to a LED display device, coupled to the average output and giving a visual indication of the value and sign of the averager output signal, the sampler and average circuits forming a so-called "boxcar integrator", that is an essentially RC low-pass filter having a switch in series to the resistor.

7 Claims, 13 Drawing Figures

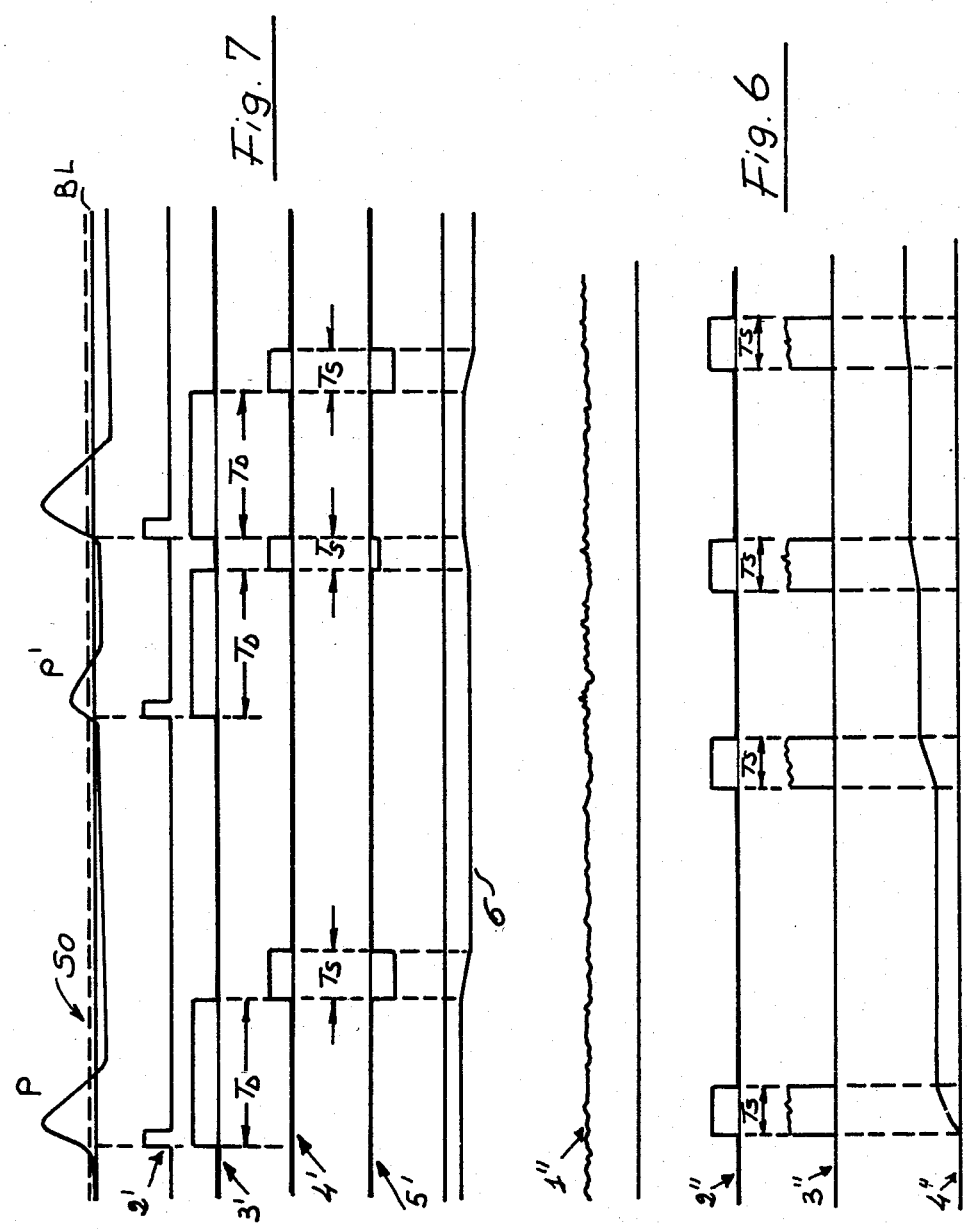

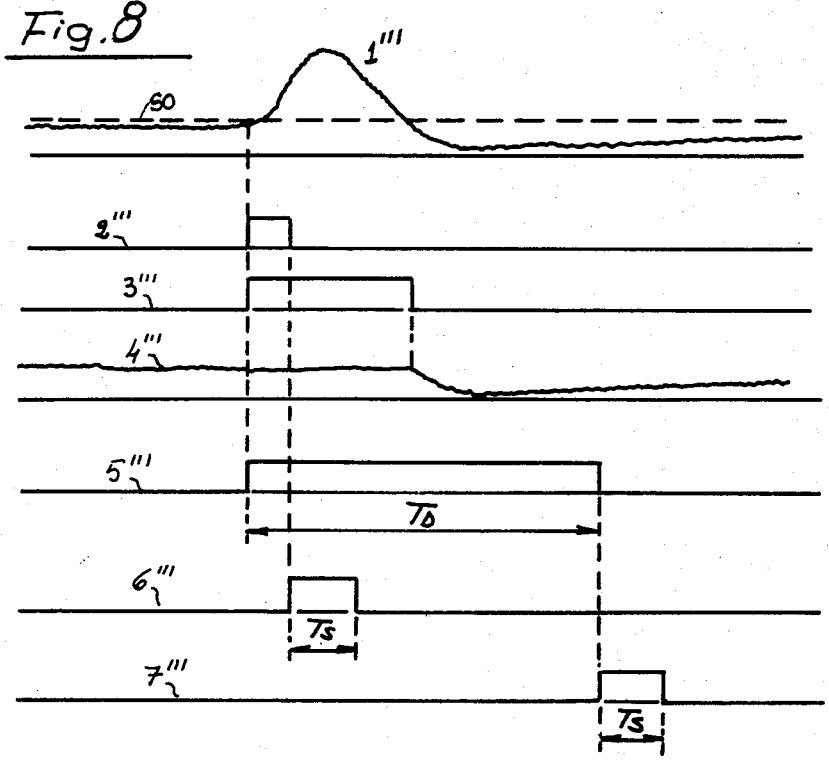
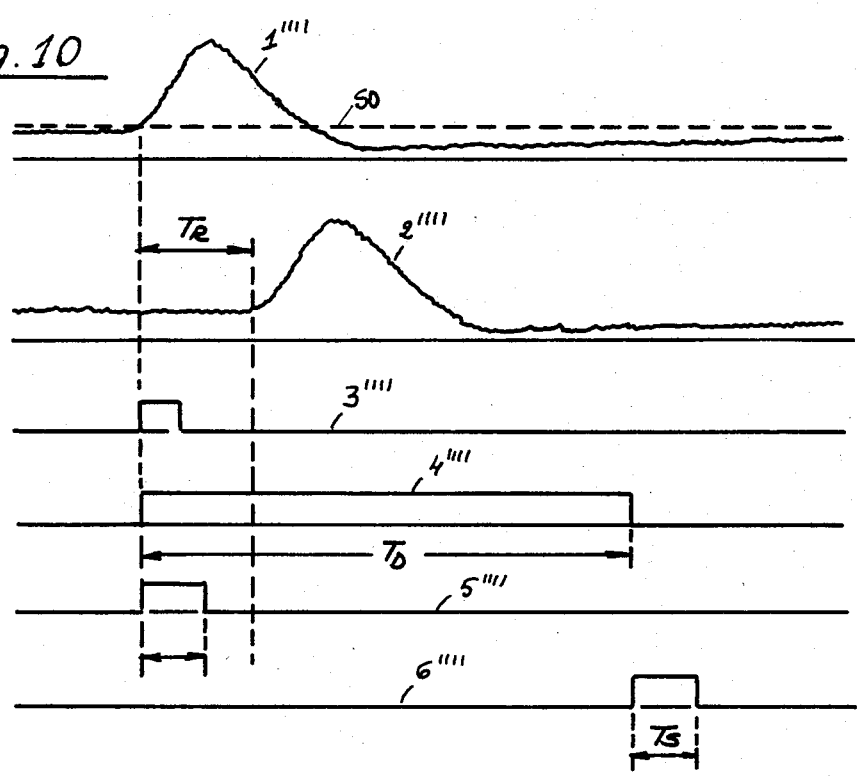

DEVICE FOR INDICATING POLE-ZERO CANCELLATION, IN PARTICULAR FOR AMPLIFIERS FOR IONIZING RADIATION SPECTROSCOPY

BACKGROUND OF THE INVENTION

The present invention relates in general to the field of ionizing radiation pulse spectroscopy and more specifically to a device for indicating the correct Pole-Zero Cancellation in Spectroscopy Amplifiers.

It is well known that in ionizing radiation spectroscopy, that is, in measurements of energies of radiations such as alpha, beta and gamma rays, accelerated ions etc., it is usual to employ radiation detectors, preamplifiers, amplifiers and multichannel pulse-amplitude analyzers. The present invention concerns in particular such spectroscopy amplifiers.

As it is also known Spectroscopy Amplifier has to filter the noise and process the pulses received from a preamplifier, associated to the detector, in such a way as to satisfy so that it be possible stringent requirements, so that it be possible to exploit, in the operation conditions, the high resolution obtainable with modern semiconductor detectors. In the mentioned spectroscopy amplifiers the output pulse shape may be different depending on the circuit configuration of the amplifier itself. In practice, the most widely employed and satisfactory pulse shaping is the so-called semi-gaussian shaping, which provides, through active filters, a pulse shape that approximates a gaussian function.

Whatever is the selected pulse shape, it is very important to make sure that, in the actual operating conditions, this shape is not altered by spurious "tails", that is, by additional contributions having low amplitudes, but long durations, extending over time intervals much longer than the envisaged pulse width. In fact, these "tails" deteriorate the resolution of the amplitude measurement in all practical cases where the pulse repetition rate is not very low.

Spurious tails can be caused by an imperfect matching of the amplifier filtering and pulse-shaping networks to the shape of the pulse received from the preamplifier. This pulse has usually a quite short rise time followed by an exponential decay, having a time-constant $T_{pa}$, which normally varies from a few tens of microseconds upwards.

Since the value of $T_{pa}$ varies from preamplifier to preamplifier, all modern spectroscopy amplifiers include control means which makes it possible to adjust the amplifier pulse-shaping in order to match it to the specific preamplifier used, by exploiting the Pole-Zero adjustment technique, thereinafter called P/Z.

For the sake of brevity, in the following the Pole-Zero Adjustment will be denoted simply by P/Z.

A main problem associated with the mentioned spectroscopy amplifiers is to be able, while acting on the P/Z control, to find out the setting at which the pulse has an accurate baseline recovery, at the end of its designed shape. To this aim, it is required to ascertain the existence of slow tails having amplitudes even of the order of $10^{-3}$ of the pulse peak and less, with positive or negative signs. This means to verify at the amplifier output the existence of tails of the order of 10 mV and less, following pulses with amplitudes up to 10 V. This check has to be made in the actual operating conditions, with an electronic noise having an amplitude comparable to or even higher than that of the tails to be checked.

The adjustment is usually made by observing directly on an oscilloscope the waveforms. In such a procedure, besides the difficulty of evaluating the amplitude of tails buried in the noise, other difficulties arise since the oscilloscope is overloaded by the main pulse, which precedes the tail. As a matter of fact, in order to observe the tail, it is necessary to use an expanded vertical scale of the oscilloscope, typically from 10 to 50 mV/div.; in these conditions, a 10 V pulse perturbs the oscilloscope input circuits and deforms the oscilloscope response also in the following time interval, where the tail should be observed. At some extent, this may be avoided by "clipping" the main pulse with a diode network, added at the oscilloscope input (see FIG. 3). However, even with such a diode network, the maximum amplitude of the clipped pulse may reach 0.5 V, so that it may still overload the oscilloscope on the most expanded vertical scales. The mentioned drawback is thus not eliminated, but only reduced, and therefore limits the maximum sensitivity that can be used in practice for observing the tails.

If, instead of observing artificial pulses produced by a pulse generator connected to the preamplifier test input, the adjustment is made by observing pulses produced by the detected radiations, as in principle it is advisable to do, a further difficulty arises because in general there is a statistical distribution of the amplitudes of such pulses, and therefore of their tails. These fluctuations obviously enhance the difficulty of ascertaining the amplitude of the tails.

In summary, the P/Z adjustment by means of an oscilloscope requires a very skilled operator, and is affected by the following drawbacks:
 (a) an oscilloscope must be available; in practical instances this fact may cause difficulties to many of the users.
 (b) The noise at the amplifier output obscures the small tails.
 (c) The vertical sensitivity which can be employed in the oscilloscope must be limited, in order to avoid that the oscilloscope be overloaded.
 (d) The measurement of the radiation pulse tail amplitude is made very difficult by the statistical amplitude distribution of the pulses themselves.

SUMMARY OF THE INVENTION

The main object of the present invention is therefore to obviate the above mentioned drawbacks by providing a Pole-Zero cancellation indicating device effective to perform an accurate pole-zero adjustment without the necessity of employing an oscilloscope.

Another object of the present invention is to provide such a device which does not require the use of any subsidiary pulse generators, that is able of operating by using just the pulses generated by the radiations to be analyzed.

A further object of the present invention is to provide such a device which is effective to make the P/Z adjustment easy and fast even for unskilled operators, with a high precision, that is, with a very low-amplitude of the residual tails.

According to one aspect of the present invention, the above mentioned objects, as well as yet other objects, which will become more apparent thereinafter are achieved by a Pole-Zero cancellation indicating device, particularly for ionizing radiation spectroscopy amplifiers having the characterizing features defined in the characterizing portion of claim 1.

BRIEF DESCRIPTION OF THE DRAWINGS

Further characteristics and advantages of the Pole-Zero cancellation indicating device according to the invention will become more apparent thereinafter from the following detailed description of a preferred embodiment thereof, being illustrated, by way of example and not of limitation, in the accompanying drawings, where:

FIG. 6, illustrates the operation of the boxcar integrator of FIG. 5;

FIG. 7, illustrates the overall operation of the device according to the invention;

FIG. 8, is a diagram useful for understanding the operation of a further embodiment of the device according to the invention, in which an additional sample and hold circuit is included for measuring the level of the pulse baseline in cases where it is not at ground potential;

FIG. 10, is a schematic diagram of another embodiment of the device in which an additional delay line is used in order to measure the level of the pulse baseline, as it is not at ground potential;

DESCRIPTION OF THE PREFERRED EMBODIMENTS

Figure 4:
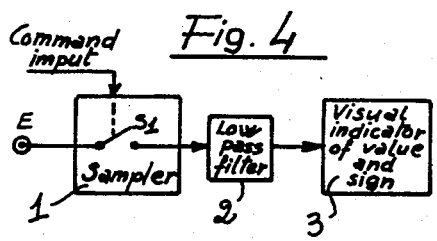
FIG. 4, is a schematic block diagram of an embodiment of the Pole-Zero cancellation indicating or detecting device according to the present invention.

With reference to the Figures of the accompanying drawings and, more specifically, to FIG. 4, a schematic block diagram of an embodiment of the Pole-Zero cancellation device according to the invention is herein illustrated.

Figure 1:
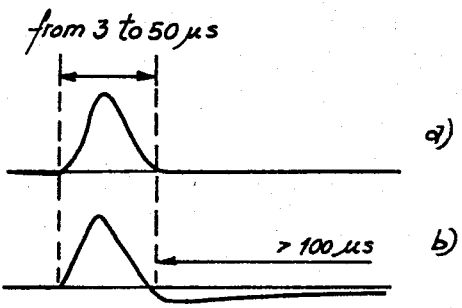
FIG. 1, is a schematic diagram showing the pulse waveforms of an ionizing radiation spectroscopy amplifier.
Figure 2:
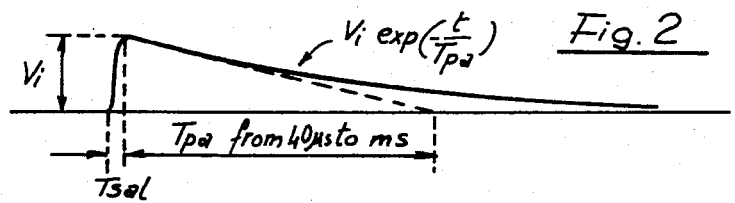
FIG. 2, shows the shape of pulses received from a preamplifier assembly.
Figure 3:
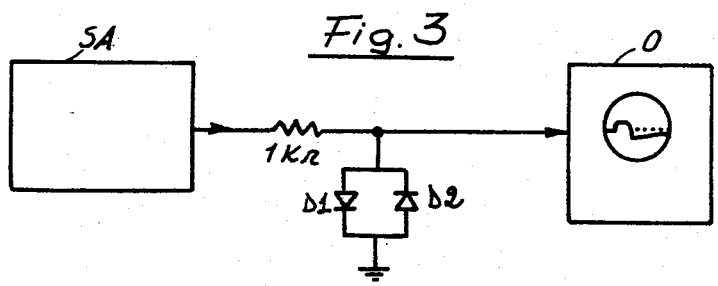
FIG. 3, shows the prior procedure for P/Z adjustment by using an oscilloscope.

As shown, the device comprises a sampler and averaging block, indicated at 1, cascade coupled with a low-pass filter 2 and with a value and sign indicating or display block 3, the input E of the block 1 receiving the output of the spectroscopy amplifier SA to be tested. In this connection it should be noted that the amplifier block SA is shown in FIG. 3, relating to the test method of the prior art consisting of testing the amplifier SA by means of an oscilloscope O, through the interposition of a clipping diode network D1, D2.

With reference to FIG. 7, the device of FIG. 4, starting at the leading edge of each pulse P presets a delay $T_D$ sufficient to mark an instant thereat the amplifier pulse, in its standard form (that is with a precise P/Z) can be considered as completely ended, that is as having such a small amplitude that it negligibly deviates from the baseline BL. Then the device, starting from the trailing edge of the pulse $T_D$, provides a short time interval or slot $T_S$, of the order of few microseconds. In that time slot it takes the signal at the output of the amplifier SA and processes it in order to filter out the noise and generate a quasi-continuous signal indicated in FIG. 9 at 6. As it will be apparent to those skilled in the art, the possible tails following the pulses contribute in such a way that this quasi-dc signal represents the mean value of the tail amplitude, averaged over a number of pulses sufficiently high to reduce to an acceptable value the fluctuations caused by the statistical pulse-amplitude distribution, the mentioned number varying typically from $10^2$ to $10^3$ pulses.

The operation of the circuit will preferably be designed in such a way that the sampling-averaging operation is practically independent on the repetition rate of the pulses within the range in which the P/Z adjustement is usually performed (e.g. from 10 Hz to about 10 KHz).

In order to avoid that at some instants an erroneous indication occurs, caused by the random arrival of another pulse following the one therefrom the mentioned delay $T_D$ is set, it is advisable that the sampling driving means act in such a way that, in the sampling and averaging operation, only that part of $T_S$ is used which is not overlapped by possible further pulses. The occurrence of such a further pulse in $T_S$ and the corresponding curtailment of the sampling interval are illustrated for the second pulse P' in FIg. 7.

With continued reference to FIG. 7, it should be noted that the reference 2' represents signals indicative of the arrival of pulses above the auxiliary threshold SO, the reference 3' indicating the delay $T_D$ pulses generated by monostable means (not specifically shown) included in the block 1 and provided for testing the tails. Finally, the reference numbers 4' and 5' respectively indicate the output of further monostable means (not specifically shown) that set the mentioned durations $T_S$ of the tail test time interval, and that part of the output waveform that is seen by said block 1.

It should also be noted that the processing of the amplifier signal for providing the quasi-dc signal 6 may be carried out by conventional circuit means for implementing sampling and averaging operations, that is circuit means including on the signal path a linear gate device followed by a low-pass filter (see the block 2).

The preferred type of sampling and averaging circuit is the so-called "boxcar integrator". This is a well known type of circuit, comprising, as it is shown in FIG. 5, a switch $S_1$, a resistor R and a capacitor C coupled as shown, it operates according to the signal waveforms of FIG. 6, therein:

(1″) is the input signal to the boxcar
(2″) is a command for closing the switch $S_1$
(3″) is the part of the input signal processed by the boxcar
(4″) is the output signal from the boxcar (with time constant $RC \simeq 5T_S$ in the example of the figure).

In operation, the switch $S_1$ is closed only in the time intervals $T_S$. During these intervals the waveform arriving at the input is integrated with a time constant RC. At the end of every slot $T_S$, the capacitor C remains at the level reached and holds the stored charge, waiting for the following interval $T_S$. Therefore, as far as the amplitude of the boxcar output signal is concerned, the result is just as if the idle time intervals between the various $T_S$ were non-existent. The amplitude of the boxcar output signal has thus a value equal to that of an ordinary RC filter which received the signal and noise in the various intervals $T_S$ one after another (without idle intervals). This output signal amplitude is a weighted average of the input values in these intervals; the average is performed over a number $N_S \simeq 5RC/T_S$ of intervals preceding the time of observation, and the weights decrease exponentially from the nearest intervals towards the more remote intervals.

Figure 5:
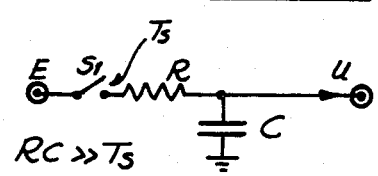
FIG. 5, shows the lain circuit elements of a boxcar integrator included in the device of FIG. 4.

In other words the boxcar circuit outlined in FIG. 5 gives the average value of the input voltage in the intervals $T_S$, measured with respect to the ground reference, to which the other end of the capacitor C is connected. This average voltage value corresponds to the desired indication, that is, to the average value of the tails, provided the baseline BL of the pulses under observation corresponds to the ground level. On the other hand, in cases where this baseline has a different level, the desired indication is given by the difference between the output voltage from the boxcar circuit and the voltage corresponding to the baseline.

In order to implement a complete device, the solution can be selected among various possible equivalent alternatives:

(a) the baseline is constantly regulated by suitable auxiliary circuits, designed for holding it at a predetermined constant value, which is to be subtracted from the boxcar output value.

(b) the value of the baseline level just before the leading edge of the pulses is continuously measured and averaged, and this measure is continuously subtracted from the boxcar indication, which is the measure of the tail level after the pulses.

A solution of the type (b) can be implemented as outlined in FIG. 8, by using a conventional type of "sample-and-hold" circuit. This circuit not shown, driven by a signal that indicates the onset or leading edge of each pulse, memorizes the voltage value in this instant at the point of the amplifier (typically the amplifier output) monitored by the boxcar which inspects the tails.

During the 'hold' time, the output of the sample-and-hold circuit can be measured and averaged by using the same method described for the measurement of the tails, that this, by using another separate boxcar circuit, similar to the one used for the tails.

FIG. 8 outlines the operation for the cases in which an additional sample-and-hold circuit is used to measure a baseline level different from the reference ground level. The numbers in FIG. 8 denote the following:

(1''') output waveform from the amplifier (2''') signals that indicate the arrival of pulses that exceed the auxiliary thereshold (dashed line SO)

(3''') signals that give the "hold" command to the sample-and-hold circuit (4''') output waveform from the sample-and-hold circuit (5) output of the monostable that generates the delay $T_D$ for the tail inspection (6) signals setting the duration of the baseline inspection (7) signals setting the duration of the tail inspection (which is shortened as a further pulse arrives).

Figure 9:
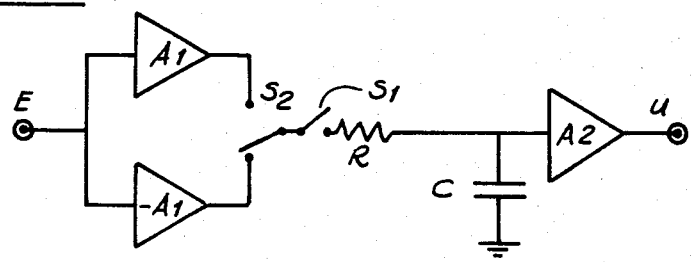
FIG. 9, is a diagram of another embodiment in which a single boxcar integrator is used for measuring both the baseline level before the pulse and the tail level after it, as the baseline level is not at ground potential.
Figure 11:
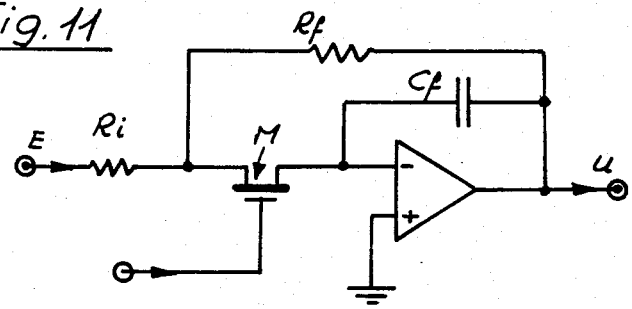
FIG. 11, shows an implementation diagram of the boxcar integrator including a MOSFET switch.

As the two inspections, of the baseline and of the tail respectively, are performed at different times, it is possible to use only one boxcar to process them, instead of two separate boxcars as above outlined. This can be done as shown in FIG. 9: the input of the boxcar is alternately connected through a switch $S_2$ to a signal path with non-inverting amplification $A_1$ (measurement of the tail after the pulse) and to a signal path with inverting amplification $A_1$ of equal absolute value (measurement of the baseline before the pulse). The switch $S_1$, when closed, determines the duration of the time intervals in which the signal is processed by the boxcar. The switch $S_2$ determines the polarity of the processed signal: the signal is summed in corrispondence to the tail measurements and subtracted in corrispondence to the baseline measuraments.

Another possible solution for operating with a baseline level different from the reference ground level avoids the use of a sample-hand-hold circuit, but instead requires the use of a conventional delay line, with a delay $T_R$ of at least 1 to 2 microseconds, interposed between the observed point in the amplifier and the input of the boxcar, which measures the baseline. The gating interval $T_S$ must be limited in this case to durations shorter then the delay $T_R$. The operation is outlined in FIG. 10; the numbers herein denote the following:

(1'''') output waveform from the amplifier (2'''') the same waveform after the delay line (not shown), having a delay $T_R > T_S$ (3'''') signals that indicate the arrival of pulses that exceed the auxiliary thereshold (dashed line SO)

(4'''') output of the monostable that generates the delay $T_D$ for the tail inspection (5'''') signals setting the duration of the baseline inspection (6'''') signals setting the duration of the tail inspection.

In this solution, the measurement of the baseline can be performed with a procedure strictly analogous to that used for the measurement of the tails, included the mention expedient of using only that part of the intervals $T_S$ which is not overlapped by possible further pulses, following the one from which the delay $T_D$ is established; in an event fraction, this function makes indeed the measurement time interval $T_S$ shorter than the nominal value.

As already stated, the most important element of the device, that is, the sampling and averaging circuit and, in particular, its preferred form, the boxcar integrator, should be implemented by means of simple circuits with performance commensurate to the amplifier, and associated to the various auxiliary circuits existing in the amplifier itself.

Two circuit configurations, meeting such requirements have been implemented and tested. In practice, it is advisable in both types to use before the circuit a preamplifier stage, with gain $A_p$ of the order of about 20, and a clipping diode network that limits the maximum amplitude of the pulse, as the one shown in FIG. 3.

IMPLEMENTATION OF THE BOXCAR BY MEANS OF A MOSFET SWITCH (FIG. 11)

The MOSFET M performs the function of the switch $S_1$ in FIG. 5. When it is closed, the circuit behaves just as a normal active integrator, with time constant $R_f C_f$ and dc gain $R_f/R_i$. When it is open, the capacitor $C_f$ holds the charge level reached (it is discharged only by the very small leakage current) and the output remains at a constant level, waiting for the subsequent closing. This circuit is equivalent to the scheme in FIG. 5 with $RC = R_f C_f$.

IMPLEMENTATION OF THE BOXCAR WITH A GATED TRAMSCONDUCTANCE AMPLIFIER (FIG. 12)

This scheme is based on the use of a so-called transconductance amplifier (high impedance input, high impedance output) of a type having an auxiliary gate command, which interrupts its operation and leaves its output isolated, that is, with a high impedance and zero current. A typical example of such a circuit is the integrated circuit RCA CA 3080. The function of the switch $S_1$ in FIG. 5 is performed by the gate command of the CA 3080: the switching-on of the CA 3080 corresponds to the closing of the switch $S_1$. With the CA 3080 switched on, the circuit behaves like an active integrator, with time-constant $C_o/g_m$ ($g_m$ = transconductance of CA 3080) an dc gain $R_f/R_i$. When CA 3080 is switched off, the capacitor $C_o$ holds the charge level reached. In order to actually obtain this, the circuit $I_2$ must have a high input impedance and a very low bias current; typically, it should have a FET input stage, as for instance the integrated circuit type $\mu$AF 774. The circuit is equivalent to the scheme in FIG. 5 with $RC = C_o/g_m$.

Figure 12:
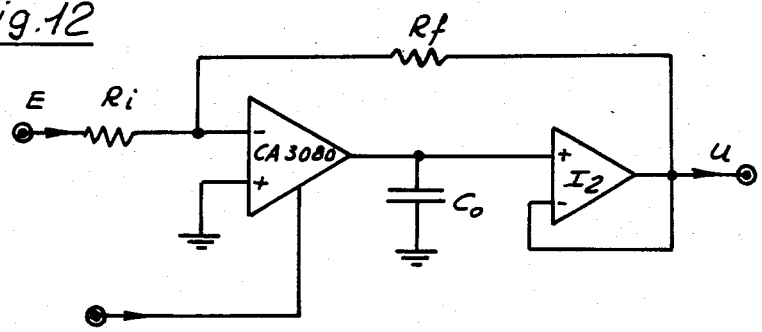
FIG. 12, shows a further implementation diagram of the boxcar integrator including a gated transconductance amplifier.

From a practical standpoint, the circuit with the trasncondutance amplifier shown in FIG. 12 results to be more simple and effective.

Figure 13:
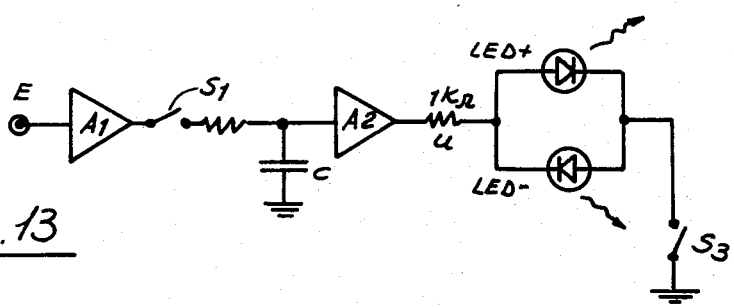
FIG. 13, shows a schematic diagram of preferred embodiment of the indicating device according to the invention.

The circuit indication may be read out in a very simple way, without using any instruments for measuring of the output voltage as in the prior art. In fact owing to the provided amplification, the values of the output dc voltage are sufficiently high to light two LED's (light-emitting-diode), mounted on the amplifier front panel, so that they can be readily seen by the operator. As shown in FIG. 13, the two LEDs (LED+ and LED−) are connected to the circuit output in such a way that one (LED+) of them is lighted for a positive output voltage, the other one (LED−) for a negative output voltage. The switch $S_3$ in FIG. 13 is used to disactivate the display. As a matter of fact, the complete device is set into operation only when the P/Z adjustment is performed, and is disactivated during the subsequent measuring of the spectra.

I claim:

1. A device for indicating or detecting the pole-zero cancellation in ionizing spectroscopy amplifiers, characterized in that it comprises, cascade coupled to one another and to the output of said amplifier, sampling and averaging controlled circuit means, low pass filter means and display means for displaying the amplitude and sign of the output of said sampling and averaging controlled circuit means, said sampling and averaging controlled circuit means being effective to operate on random-time and random amplitude pulses for providing information about the sign of said pulses and averaging a plurality of samples thereof.

2. A device according to claim 1, characterized in that said sampling and averaging controlled circuit means comprise:
 (a) means for setting, starting from the leading edge of each said pulse, a delay time for marking an instant when said pulse, in its standard form (that is, with a precise pole/zero adjustment), can be considered completely ended;
 (b) means for setting, starting from said delay time, a further short time interval; and
 (c) means for filtering, in said short time interval, the signal from said amplifier and providing a quasi-dc signal indicative of the mean value of said pulse tail amplitude, averaged over a number of said pulses.

3. A device according to claim 2, characterized in that said sampling and averaging controlled circuit means are so controlled that only that part of said further short time interval is used which is not overlapped by further pulses.

4. A device according to claim 2, characterized in that said number of said pulses is from $10^2$ to $10^3$ pulses.

5. A device according to claim 1, characterized in that said controlled sampling and averaging circuit means consist of a "boxcar" integrating circuit.

6. A device according to claim 1, characterized in that, in the case of operation with a baseline level different from ground, a sample and hold circuit is used coupled to the input of said controlled sampling and averaging means, the output of said sample and hold circuit being coupled to two amplifiers with gains of opposite sign and equal absolute value.

7. A device according to claim 6, characterized in that a switch is operatively coupled to said amplifiers for switching the input of said controlled sampling and averaging circuit means to the output of either one or the other of said amplifiers for sampling the baseline before and after a said pulse respectively.

* * * * *